United States Patent
Sugimoto et al.

(10) Patent No.: US 11,088,001 B2
(45) Date of Patent: Aug. 10, 2021

(54) SUBSTRATE TRANSFER METHOD AND SUBSTRATE TRANSFER MODULE

(71) Applicant: TOKYO ELECTRON LIMITED, Tokyo (JP)

(72) Inventors: Takashi Sugimoto, Nirasaki (JP); Shinya Okano, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 146 days.

(21) Appl. No.: 16/577,676

(22) Filed: Sep. 20, 2019

(65) Prior Publication Data

US 2020/0098604 A1 Mar. 26, 2020

(30) Foreign Application Priority Data

Sep. 21, 2018 (JP) .............................. JP2018-177798

(51) Int. Cl.
| | |
|---|---|
| *H01L 21/67* | (2006.01) |
| *H01L 21/677* | (2006.01) |
| *B65G 47/90* | (2006.01) |
| *H01L 21/687* | (2006.01) |

(52) U.S. Cl.
CPC ........ *H01L 21/67265* (2013.01); *B65G 47/90* (2013.01); *H01L 21/67766* (2013.01); *H01L 21/67778* (2013.01); *H01L 21/68707* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,906,469 | A | * 5/1999 | Oka | ................... H01L 21/67265 414/416.08 |
| 2008/0127467 | A1* | 6/2008 | Hirano | .............. H01L 21/67265 29/25.01 |
| 2014/0277690 | A1* | 9/2014 | Yoshida | ............ H01L 21/67781 700/214 |

FOREIGN PATENT DOCUMENTS

| | | |
|---|---|---|
| JP | H9-148403 A | 6/1997 |
| JP | 2811238 B2 | 10/1998 |
| KR | 1020140111957 A | 9/2014 |

* cited by examiner

*Primary Examiner* — Alia Sabur

(74) *Attorney, Agent, or Firm* — Nath, Goldberg & Meyer; Jerald L. Meyer; Tanya E. Harkins

(57) ABSTRACT

A substrate transfer method includes loading a transfer container on a loading part, transferring the substrate between the transfer container and the housing by a transfer mechanism including a substrate support part supporting the substrate, acquiring a reference height of each substrate in the transfer container before performing the loading the transfer container, detecting a height of each substrate in the transfer container after the acquiring the reference height and before the transferring the substrate, obtaining a first difference value between the detected height and the reference height, with respect to one substrate in the transfer container, determining an entry height of the substrate support part at which the substrate support part enters the transfer container by selecting one of a first entry height corresponding to the reference height of the one substrate and a second entry height corrected based on the first difference value.

5 Claims, 9 Drawing Sheets

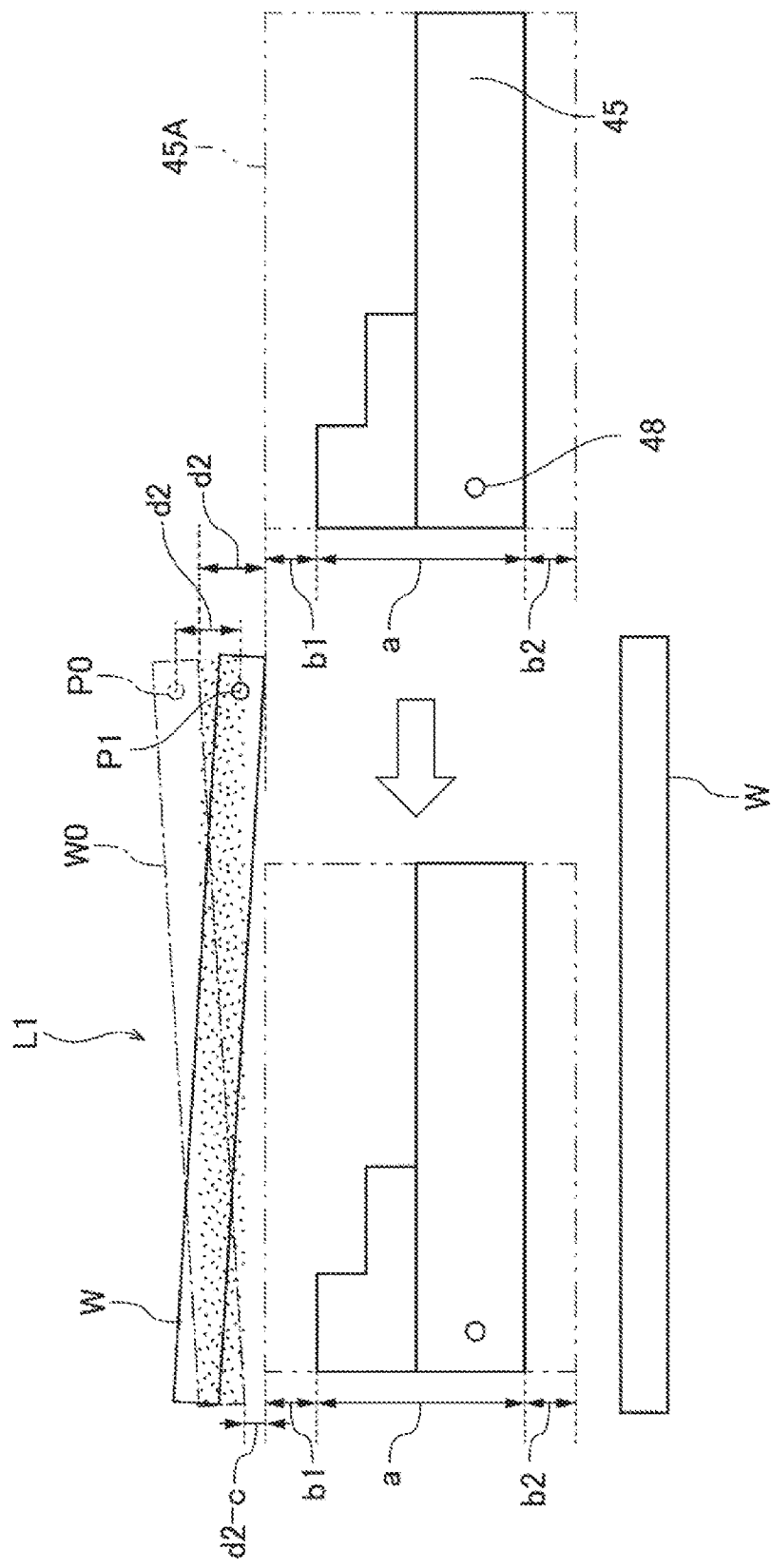

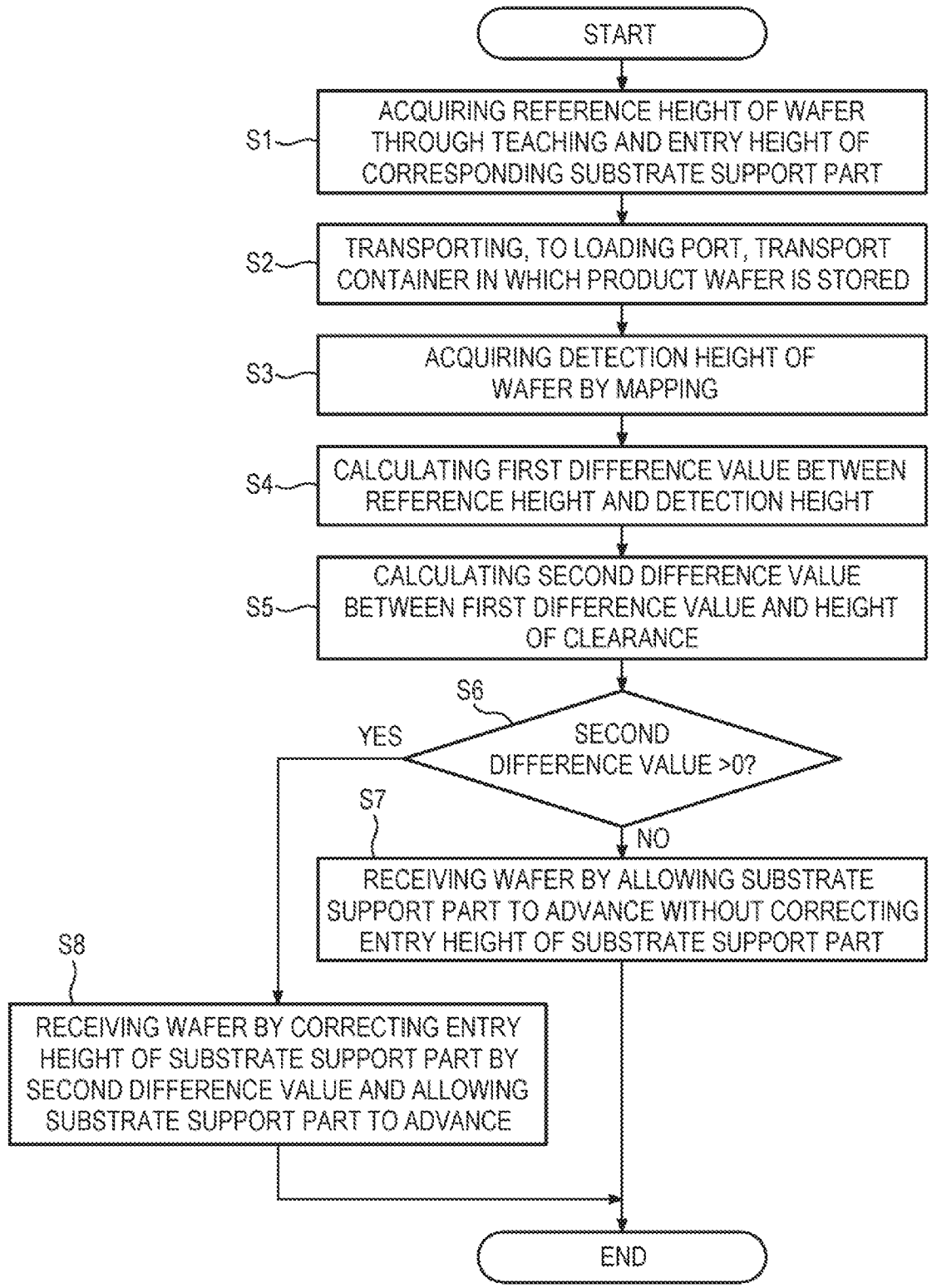

SUBSTRATE TRANSFER METHOD AND SUBSTRATE TRANSFER MODULE

CROSS-REFERENCE TO RELATED APPLICATION

This application is based upon and claims the benefit of priority from Japanese Patent Application No. 2018-177798, filed on Sep. 21, 2018, the entire contents of which are incorporated herein by reference.

TECHNICAL FIELD

The present disclosure relates to a substrate transfer method and a substrate transfer module.

BACKGROUND

In a semiconductor-device-manufacturing process, a plurality of semiconductor wafers (hereinafter, referred to as wafers), which is substrates, is stored in a multiple stack in a transfer container and transferred in a factory for transfer. Then, in a processing apparatus as a transfer destination, a transfer mechanism takes out the substrates one by one from the above-described transfer container to perform processing thereon. Patent Document 1 discloses a substrate detection apparatus including: an optical sensor having a light-transmitting element and a light-receiving element disposed opposite each other with a cassette (transfer container) interposed therebetween; and a vertical driving means for moving the optical sensor in the vertical direction with respect to the cassette. In this substrate detection apparatus, the vertical position of the wafer in the cassette is detected based on the output from the optical sensor, and the arm (transfer mechanism) enters the cassette based on the detection result and receives the wafer.

PRIOR ART DOCUMENT

Patent Literature

[Patent Document 1] Japanese Patent Application Laid-Open No. H09-148403

SUMMARY

According to embodiments of the present disclosure, there is provided a substrate transfer method including: loading a transfer container for vertically storing a plurality of substrates on a loading part provided on an outer side of a housing such that a substrate outlet formed in a lateral side of the transfer container overlaps a substrate transfer opening formed in a side wall of the housing; transferring the substrate between the transfer container loaded on the loading part and an inside of the housing by a transfer mechanism including a substrate support part supporting a lower surface of the substrate, the substrate support part moving in a vertical direction and a horizontal direction; acquiring a reference height of each substrate in the transfer container loaded on the loading part before performing the loading the transfer container and the transferring the substrate; detecting a height of each substrate in the transfer container loaded on the loading part by a sensor part after the acquiring the reference height and the loading the transfer container and before the transferring the substrate; obtaining a first difference value corresponding to a difference between the height of the substrate detected in the detecting the height and the reference height, with respect to one substrate in the transfer container; subsequently, determining an entry height of the substrate support part at which the substrate support part enters the transfer container by selecting one of a first entry height corresponding to the reference height of the one substrate and a second entry height corrected based on the first difference value, based on a predetermined height interval and the first difference value; and receiving the one substrate by allowing the substrate support part to enter the transfer container at the determined entry height.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is an explanatory view illustrating a method of determining an approach height of a substrate support part in an embodiment.

FIG. 9 is a flowchart illustrating a method of determining an approach height of a substrate support part in an embodiment.

DETAILED DESCRIPTION

Figure 1:
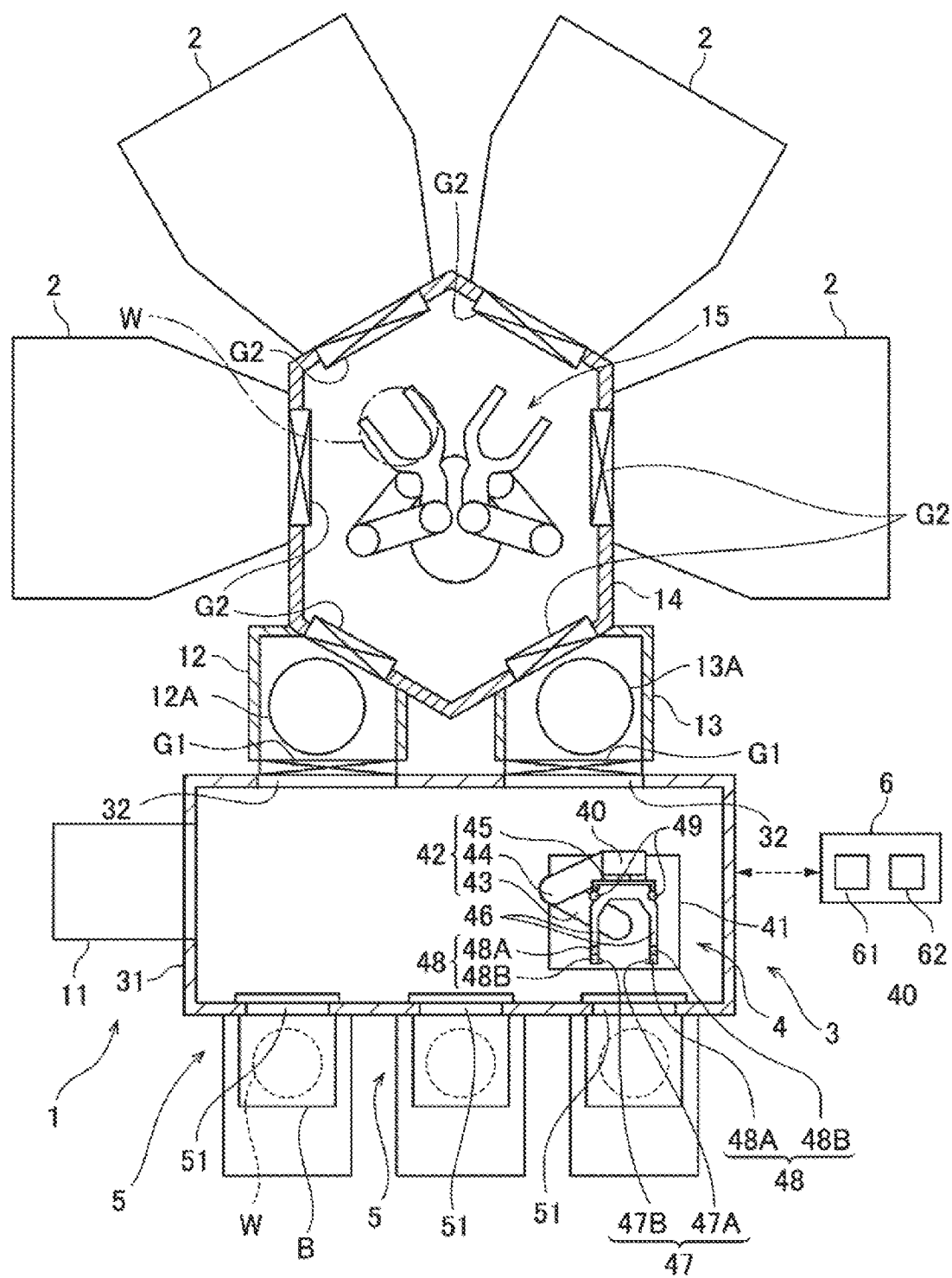
FIG. 1 is a plan view showing a vacuum-processing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as to avoid unnecessarily obscuring aspects of the various embodiments.

A vacuum-processing apparatus 1 including a loader module 3 according to one embodiment of the present disclosure will be described with reference to FIG. 1. The loader module 3 may be an Equipment Front End Module (EFEM) having a long transversal length. The inside of the loader module 3 is formed in an atmospheric environment and a normal pressure atmosphere. The loader module 3 is configured as a substrate transfer module for taking out a corresponding wafer W from a transfer container B, which is a closed container for storing a plurality of wafers W, and loading the wafers W into the vacuum-processing apparatus 1.

On the lateral portion of the loader module 3, an alignment module 11 for adjusting the orientation of the wafer W and adjusting the eccentricity thereof is provided. In left and right portions on the rear side of the loader module 3, load lock modules 12 and 13 are provided. The load lock modules 12 and 13 are configured similarly to each other. The inside of the load lock modules 12 and 13 may be configured to be switchable between normal pressure of $N_2$ (nitrogen) gas atmosphere and a vacuum atmosphere in order to transfer the wafer W between the loader module 3 and a vacuum transfer module 14 described below. In the figures, 12A and 13A are the stages for the wafers W respectively provided in the load lock modules 12 and 13. Also, a gate valve G1 is interposed between each of the load lock modules 12 and 13 and the loader module 3.

On the rear side of the load lock modules 12 and 13, there is provided the vacuum transfer module 14, inside which a vacuum atmosphere is maintained. The vacuum transfer module 14 includes a transfer arm 15. For example, four film-forming modules 2 are connected along the periphery of the vacuum transfer module 14, and a gate valve G2 is interposed between the vacuum transfer module 14 and the film-forming module 2.

For example, the film-forming module 2 includes a vacuum container, a stage for loading the wafers inside the vacuum container while heating the wafers, and a shower head, which is a gas supply part. For example, a $TiCl_4$ (titanium tetrachloride) gas, acting as a raw material gas, and an $NH_3$ (ammonia) gas, acting as a reducing gas, are supplied from the shower head. In a period between the period in which the $TiCl_4$ gas is supplied and the period in which the $NH_3$ gas is supplied, the $N_2$ gas is supplied as a purge gas from the shower head. That is, in this film-forming module 2, Atomic Layer Deposition (ALD) is performed on the wafer W to form a TiN (titanium nitride) film.

The wafers W stored in a transfer container B are transferred in the order of the loader module 3, the alignment module 11, the loader module 3, the load lock module 12 or 13, the vacuum transfer module 14, and the film-forming module 2, and are subjected to film-forming processes. The wafers W subjected to the film-forming processes are transferred in the order of the film-forming module 2, the vacuum transfer module 14, the load lock module 12 or 13, the loader module 3, and the transfer container B. The transfer of the wafers W among the load lock modules 12 and 13, the vacuum transfer module 14, and the film-forming module 2 is performed by the transfer arm 15. The transfer of the wafers W among the transfer container B, the alignment module 11, the loader module 3, and the load lock modules 12 and 13 is performed by a transfer mechanism 4 provided in the loader module 3, which will be described later.

Next, the loader module 3 will be described in detail with reference to a vertical sectional side view of FIG. 2. The loader module 3 includes a rectangular housing 31, and the housing 31 has a rectangular shape that is transversely long in left and right directions in plan view. On the left and right portions of the rear side wall of the housing 31, transfer ports 32, which are opened and closed by the gate valves G1, are opened at intervals. In the housing 31, the transfer mechanism 4 is provided. The transfer mechanism 4 includes a table 41, which is movable in the left and right directions and can be raised and lowered, and a multi-joint arm 42, provided on the table 41. The multi-joint arm 42 includes a horizontal first arm 43, a horizontal second arm 44, and a substrate support part 45. The base end of the first arm 43 is provided to be rotatable about the vertical axis on the table 41, and the base end of the second arm 44 is provided to be rotatable about the vertical axis on the leading end of the first arm 43. The substrate support part 45 is formed in the shape of a plate extending horizontally, and the base end of the substrate support part 45 is provided to be rotatable about the vertical axis on the leading end of the second arm 44.

The leading end (front side) of the substrate support part 45 is divided into two in the left and right direction and extends forward to form two front parts 46. A light-transmitting part 47A and a light-receiving part 47B are provided at the leading end of the one front part 46 and at the leading end of the other front part 46, respectively. The light-transmitting part 47A and the light-receiving part 47B constitute a sensor part 47 in a pair. The sensor part 47 is provided for detecting (mapping) the height of the wafer W in the transfer container B, which will be described later. The light-receiving part 47B also transmits a detection signal based on the received light to a control part 6, which will be described later.

The leading end of the front part 46 of the substrate support part 45 protrudes upwards to form an L-shaped abutting part 48, as viewed from the side. With respect to the abutting part 48, the front portion, having a larger height, is referred to as a front part 48A, and the rear portion, having a lower height, is referred to as a rear part 48B. When the wafer W is lifted up from the lower side to the substrate support part 45, the wafer W is supported at the peripheral edge of the lower surface thereof by the rear part 48B and the base end of the substrate support part 45 so that the wafer W is held horizontally and transferred. A driving mechanism 40 and a roller 49, which is movable forwards and backwards by the driving mechanism 40, are provided on the base end of the substrate support part 45. The wafer W supported by the substrate support part 45 is pressed and held by the roller 49 to the front part 48A of the abutting part 48.

On the sidewall on the front portion of the housing 31, that is, the sidewall opposite the sidewall on which the transfer port 32 is provided, three transfer ports 51 are provided so as to be spaced in the lateral direction (see FIG. 1). Each transfer port 51 is provided with a loading port 5 which transfers the wafers W between the transfer container B and the housing 31 and which opens/closes the transfer port 51. This transfer container B may be a Front Open Unified Pod (FOUP), and includes a container main body B1 and a cover body B2, which is detachable from the container main body B1. The cover body B2 is detached from the container body B1, thereby opening/closing a substrate outlet B3 formed in the front side of the container body B1. The cover body B2 also has a lock mechanism (not shown) and is fixed to the container body B1 by the lock mechanism.

Figure 3:
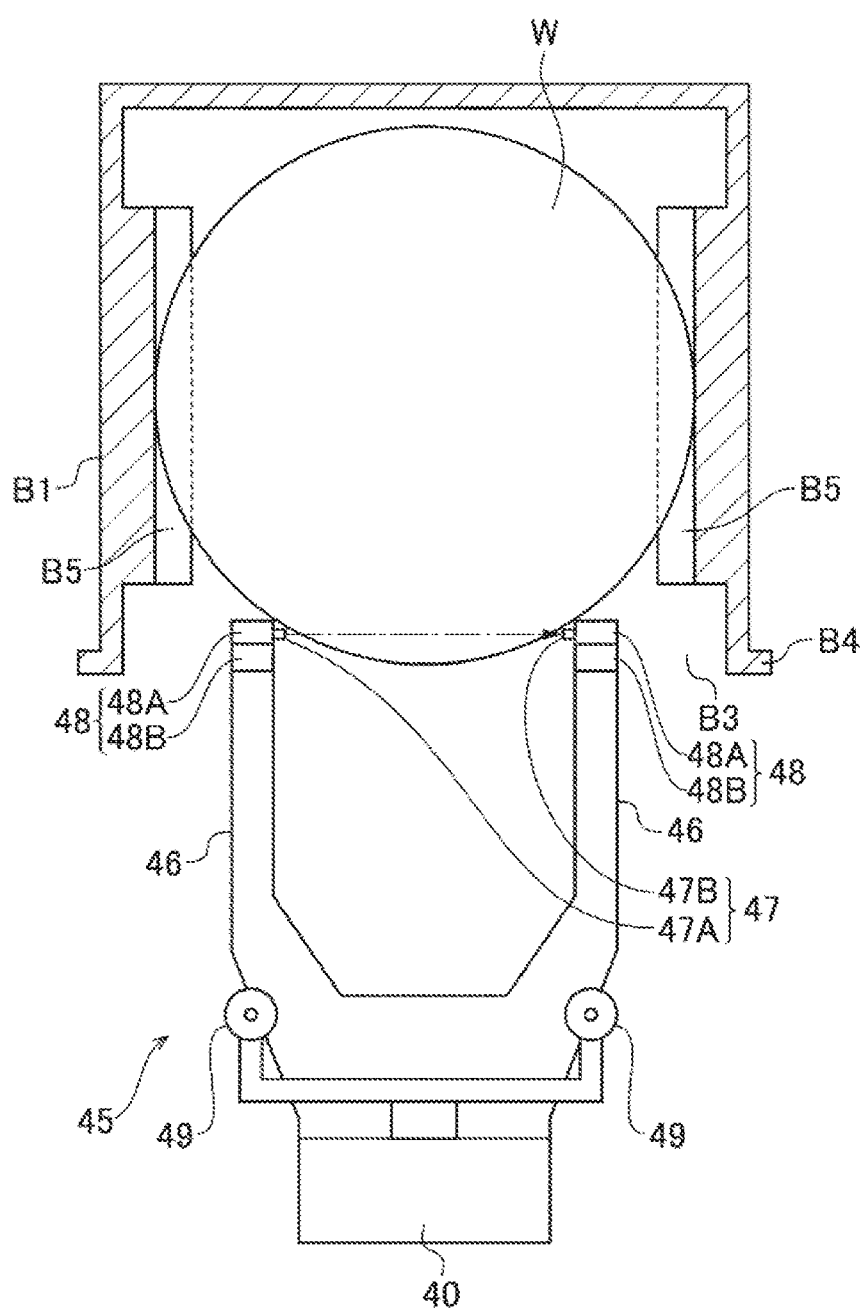
FIG. 3 is a plan view showing a substrate support part provided in the above-mentioned loader module.

FIG. 3 is a horizontal plan view of the container main body B1. As shown in FIG. 3, grooves B5 which are formed along the front and rear directions are provided on the right and left side walls of the container body B1. The grooves B5 are formed in multiple stages in a vertical direction. The peripheral edge of the wafer W is inserted and supported in each of the grooves B5, and 25 wafers W are stored in vertical stages inside the container body B1. The height of each groove B5 in the container body B1 provides a space in which the wafer W is stored, and this storage space is referred to as a slot. The slots, for example, 25 slots may be provided at equal intervals. There is the case where the slots are numbered from 1 to 25 in order from the lower slot for each slot. In receiving the wafer W from one slot, the substrate support part 45 advances horizontally from the outside of the container body B1 toward the inside of the container body B1 in the state of being positioned below the wafer W, enters the container main body B1, and then ascends to lift the wafer W and receive the wafer W. The height of the substrate support part 45 is controlled, as described later, so as not to interfere with the upper wafer W and the lower wafer W of the substrate support part 45 when the substrate support part 45 enters the container body B1. In this manner, the substrate support part 45 moves in the horizontal direction and enters the container body B1. Herein, moving in the horizontal direction means moving in the horizontal direction due to the design of the apparatus. That is, even the case of moving in a direction slightly inclined with respect to the horizontal direction due to a manufacturing error or adjustment error of the apparatus may be included in moving in the horizontal direction, if the apparatus is intended to move in the horizontal direction when designing it.

Returning to FIG. 2, the loading port 5 includes a support base 52, a moving stage 53, an opening/closing door 54, and a moving mechanism 55. Assuming that the side opposite the housing 31 about the transfer port 51 is the front side, the support base 52 protrudes toward the front side from the lower position of the transfer port 51 in the outside of the housing 31. The moving stage 53 is a loading bracket for the transfer container, which moves back and forth on the support base 52 in the state in which the transfer container B is loaded. By the movement of the moving stage 53, as shown in FIG. 2, the transfer port 51 and the substrate outlet B3 are made to overlap each other while a peripheral part B4 of the substrate outlet B3 of the container body B1 is brought into close contact with a peripheral part 56 of the transfer port 51 from the outside of the housing 31, so that the wafer W can be delivered to the container body B1. The position of the container body B1 when the peripheral part B4 is in close contact with the peripheral part 56 is referred to as a delivery position.

Figure 2:
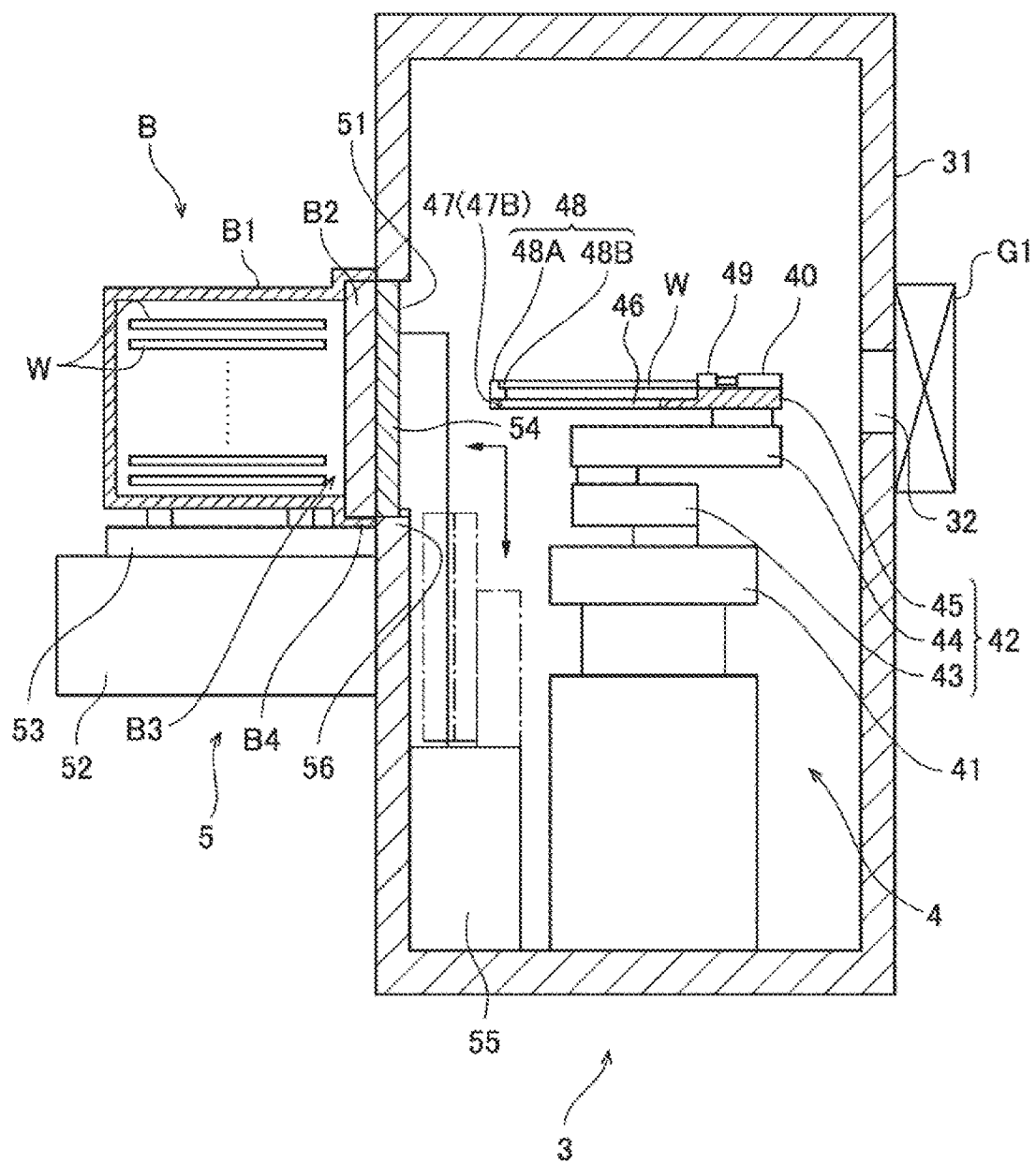
FIG. 2 is a vertical sectional side view showing a loader module provided in the above-mentioned vacuum-processing apparatus.

The opening/closing door 54 may be located at the closed position shown by the solid line in FIG. 2, and closes the transfer port 51 from the inside of the housing 31. The opening/closing door 54 includes an unlock mechanism (not shown). In the state in which the container body B is positioned at the delivery position as described above and the opening/closing door 54 is located at the closed position, the opening/closing door 54 acts on the lock mechanism of the cover body B2 to enable switching between the locked state in which the cover body B2 is locked to the container body B1 and the unlocked state. The cover body B2, which is unlocked from the container body B1 in this manner, is supported by the opening/closing door 54. The moving mechanism 55 can move the opening/closing door 54 supporting the cover body B2 to the closed position and the open position on the rear and lower sides of the closed position. The open position is a position where the opening/closing door 54 is retracted from the transfer path of the wafer W at the time of transferring the wafer W between the transfer container B and the load lock modules 12 and 13, and the chain line in FIG. 2 indicates the position of the opening/closing door 54 in the open position.

As shown in FIG. 1, the vacuum-processing apparatus 1 also includes the control part 6, which includes a computer. The control part 6 transmits a control signal to each part of the vacuum-processing apparatus 1 and controls the operation of each part. The control part 6 will be described later in detail.

Next, an operation which is referred to as "teaching" performed before the operation of the vacuum-processing apparatus 1 will be described. This teaching is an operation of storing, in the control part 6, the height of the wafer W in each slot in the transfer container B, which is suitable for a semi-standard, and the height (referred to as an entry height) at which the substrate support part 45 advances toward the transfer container B in order to receive each wafer W. Specifically, for example, the height of each wafer W is obtained by performing, for example, mapping described later with respect to the wafer W stored in the transfer container B for the teaching, which is suitable for the semi-standard as described above, and the entry height of the substrate support part 45 is determined based on the height of the wafer W. Since there is a manufacturing tolerance for each loading port 5, this teaching operation is performed for each loading port 5.

The above mapping will be described. With regard to the above mapping, the leading end of the substrate support part 45 enters the container body B1 from which the cover body B2 is detached in the delivery position, and the light-transmitting part 47A and the light-receiving part 47B positioned such that the front end of the wafer W in the vicinity of the substrate outlet B3 is interposed therebetween in a plan view. The substrate support part 45 moves up and down to each height corresponding to the slots 1 and 25 while light is radiated from the light-transmitting part 47A to the light-receiving part 47B. The chain-line arrows in FIG. 3 indicate the optical axis formed by the light radiation. The control part 6 detects the heights of each wafer W in the slot 1 and the slot 25 based on an output signal from the light-receiving part 47B, which changes in response to light interception by the front end of the wafer W. The control part 6 calculates the heights of the wafer W in the slots 2 to 24 by equally dividing the difference in the heights of the wafers W in the slots 1 and 25 using a value corresponding to the number of slots between the slot 1 and the slot 25.

However, since various types of transfer containers B are transferred to the loading port 5, there may be a case in which transfer containers B which do not meet the semi standard due to various reasons such as deterioration or a manufacturing defect are transferred. In addition, since the wafers W are stored in the transfer container B in various states, there may be a case in which the wafer is stored being shifted in height or being inclined to be not suitable for the semi standard. Therefore, when the transfer container B is transferred to the loading port 5 during the operation of the apparatus (during the manufacture of a semiconductor product), the mapping is performed to detect the height of the wafer W in each slot. Then, the control part 6 determines whether each wafer W can be received based on the height of the wafer W acquired in the above manner and the height of the wafer W acquired at the time of teaching. When it is determined to receive the wafer W, the actual entry height is determined by correcting the entry height of the substrate support part 45, which is previously obtained through teaching. As described above, the height of the wafer W acquired by mapping during the operation of the apparatus is referred to as a detection height P1. The height of the wafer W acquired in the teaching is referred to as a reference height P0.

As described above, it is required that the substrate support part 45 is not contacted with the wafer W on the upper side or with the wafer W on the lower side when entering the transfer container B. Accordingly, the entry height of the substrate support part 45 is determined so as to be lower than the acquired detection height of the wafer W.

Figure 4:
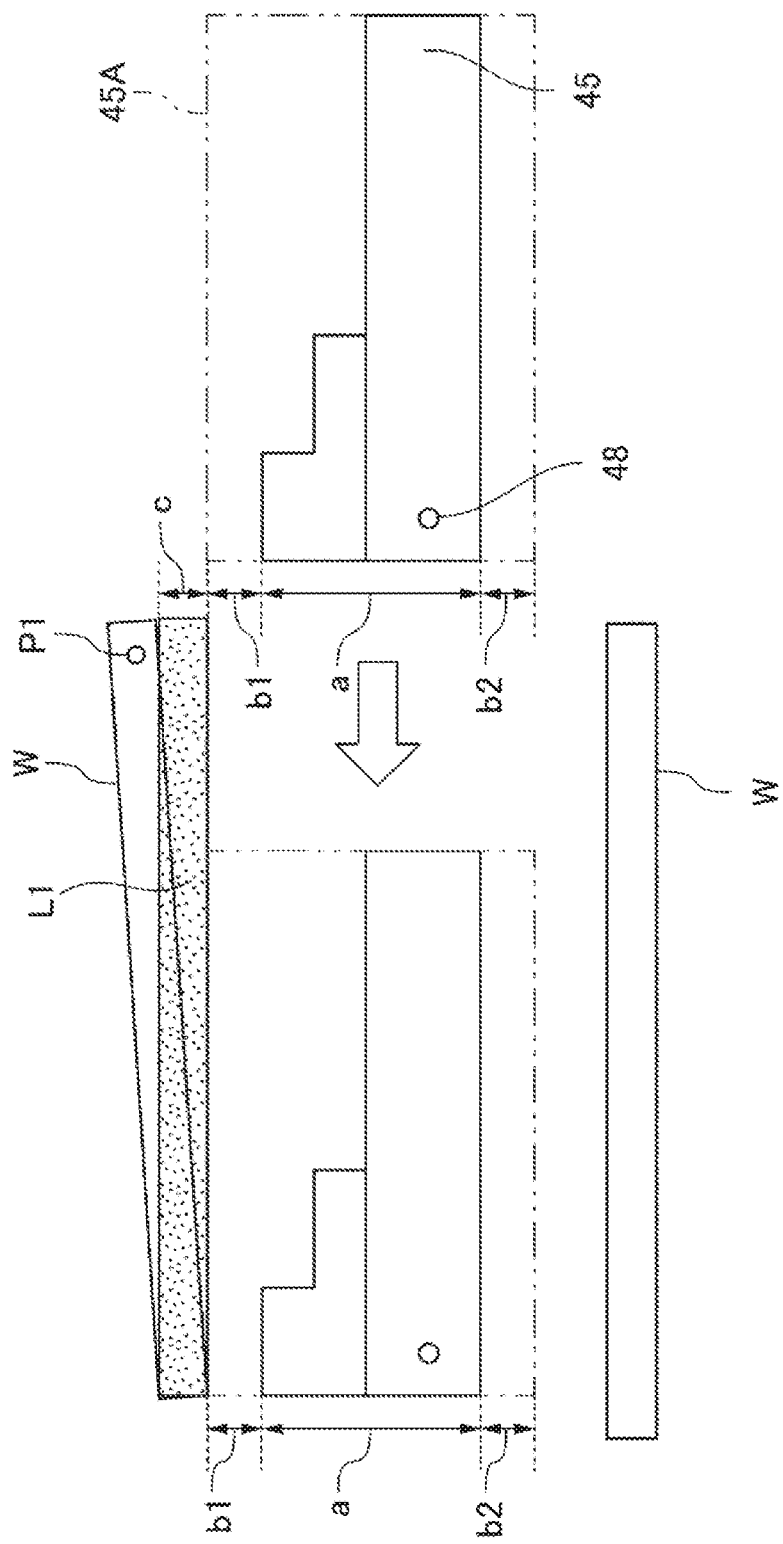
FIG. 4 is an explanatory view illustrating a clearance provided between the substrate support part and a wafer.

The relationship between the wafer W and the entry height of the substrate support part 45 will be described. The substrate support part 45 will be further described with reference to FIG. 4. FIG. 4 is a schematic diagram showing the side surface of the leading end of the substrate support part 45 entering the transfer container B and the side surface of the wafer W stored in the transfer container B. Although the substrate support part 45 is configured to be horizontal, there may actually be an error with respect to the horizontal direction. Further, the substrate support part 45 is also horizontally arranged with respect to the entry route to the transfer container B, but there may actually be an error in the horizontal direction. In addition, vertical vibration may be generated in the substrate support part 45 when the substrate support part 45 enters the transfer container B. When the vertical amplitude is large, there is a high possibility that the substrate support part 45 will come into contact with the wafer W. Although the moving stage 53 of the loading port 5 on which the transfer container B is loaded is also configured to be horizontal, there may actually be an error in the horizontal direction.

In consideration of these factors, the upper end of the substrate support part 45 is considered to be located at a height upper by b1 than the actual upper end thereof, and the lower end thereof is considered to be located at a height lower by b2 than the actual lower end thereof. In other words, even if the actual thickness of the substrate support part 45 is a, it is handled in the operation that the height b1 and the height b2 are added to the thickness a. That is, it is assumed that the substrate support part 45 which is represented by a rectangle having a thickness (height) of a+b1+b2 as viewed in a side view, enters between the wafers W. The above rectangular body is referred to as a virtual support part 45A. In FIG. 4 and each of the drawings described below, the detection height P1 is shown as the center position in the vertical width of the wafer W.

Although the entry height of the substrate support part 45 is determined using the height of the substrate support part 45 larger than the actual height thereof, for the convenience of description, prior to describing the method of determining the entry height of the substrate support part 45 according to an embodiment, a method of determining the entry height of the substrate support part 45 will be described as a comparative example. To describe the method of determining the entry height of the above comparative example, a clearance provided below the wafer W to be received in the comparative example will be described.

In the mapping as described above, the height of the wafer W on the front side (on the substrate outlet B3 side) of the container body B1 is detected, and the height of the wafer W on the rear side is not detected. However, as described above, the wafer W may be stored with inclination in the transfer container B. Therefore, even if the wafer W to be received by the substrate support part 45 is inclined such that the rearmost side is lowered within a range suitable for the semi-standard, a clearance is provided between the position of the lower surface of the front end of the wafer W, which is acquired by the mapping, and the virtual support part 45A such that the virtual support part 45A is not contacted with the rear end of the wafer W.

FIG. 4 shows an example in which the target wafer W (the wafer W to be received by the substrate support part 45) which the substrate support part 45 tries to receive is inclined such that the rearmost side of the wafer W is lowered within the range suitable for the semi-standard as described above. The wafer W inclined in the above position is referred to as the wafer in the worst case. In addition, a rectangular area represented by a plurality of dots and surrounded by a frame is a permissible area meaning an area in which the lower surface of the target wafer W is allowed to exist according to the semi-standard. More specifically, the wafer W in the worst case is a wafer W having an inclination identical to an inclination available when the front end of the lower surface of the wafer W is located at the upper end of the permissible area L1 and the rear end thereof is located at the lower end of the permissible area L1. In FIG. 4, the height of the clearance between the position of the lower surface of the front end of the wafer W and the virtual support part 45A is denoted by c. In order to avoid contact between the virtual support part 45A and the wafer W in a lower side when the virtual support part 45A enters the container body B1, the height c of the clearance is set to a necessary minimum size. Accordingly, the height c, which is a predetermined height interval, is the same as the height of the permissible area L1. Since the height c is set in the above manner, in receiving the wafers W in the worst case, in which the lower surface shown in FIG. 4 is within the permissible area L1, the height of the lower surface of the permissible area L1, the height of the rear end of the wafer W, and the height of the upper end of the virtual support part 45A are aligned with each other. In the teaching, the entry height position of the substrate support part 45 is set so that the above-described wafer W can be received.

Figure 5:
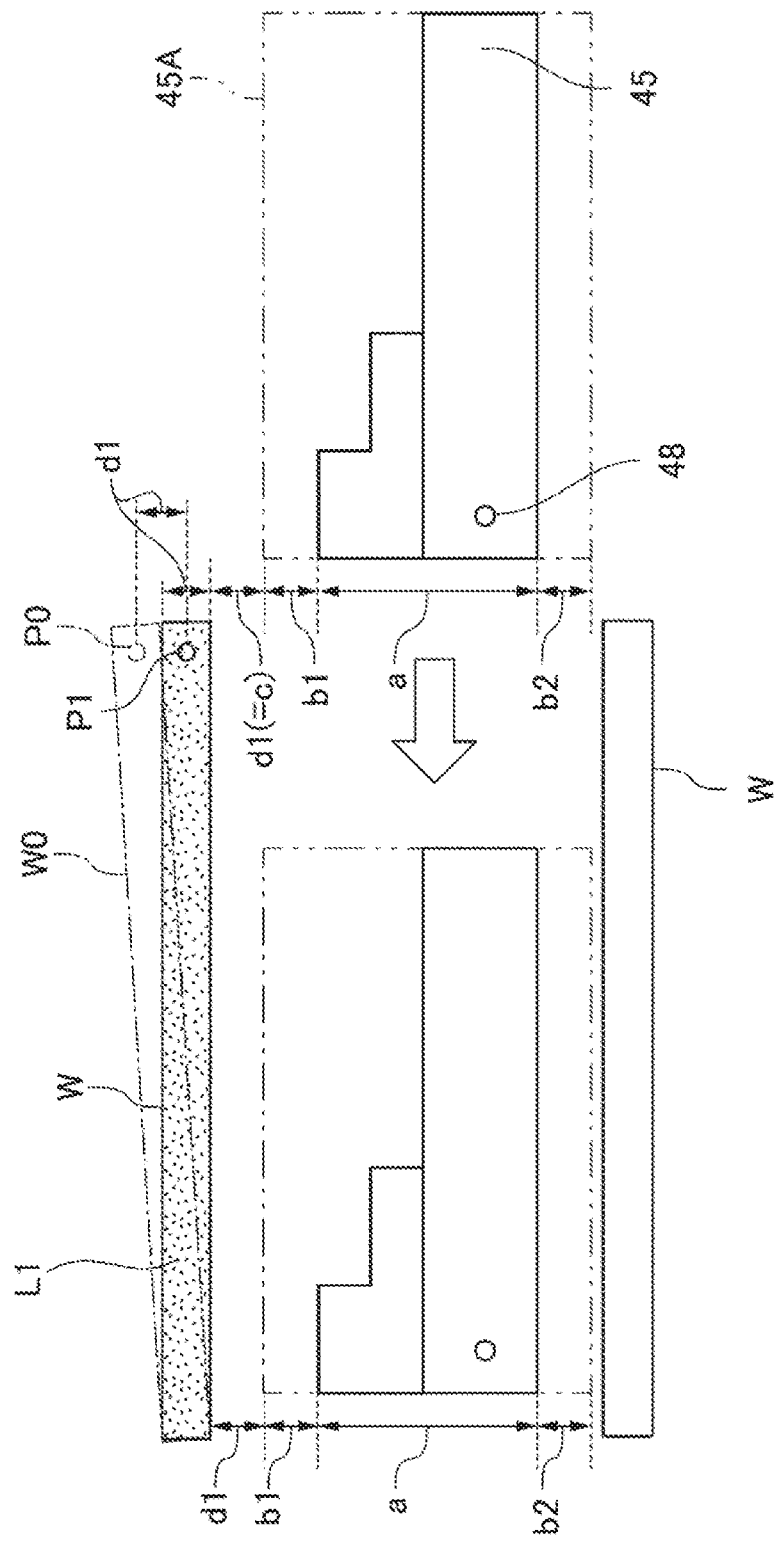
FIG. 5 is an explanatory view illustrating a method of determining an approach height of a substrate support part in a comparative example.
Figure 6:
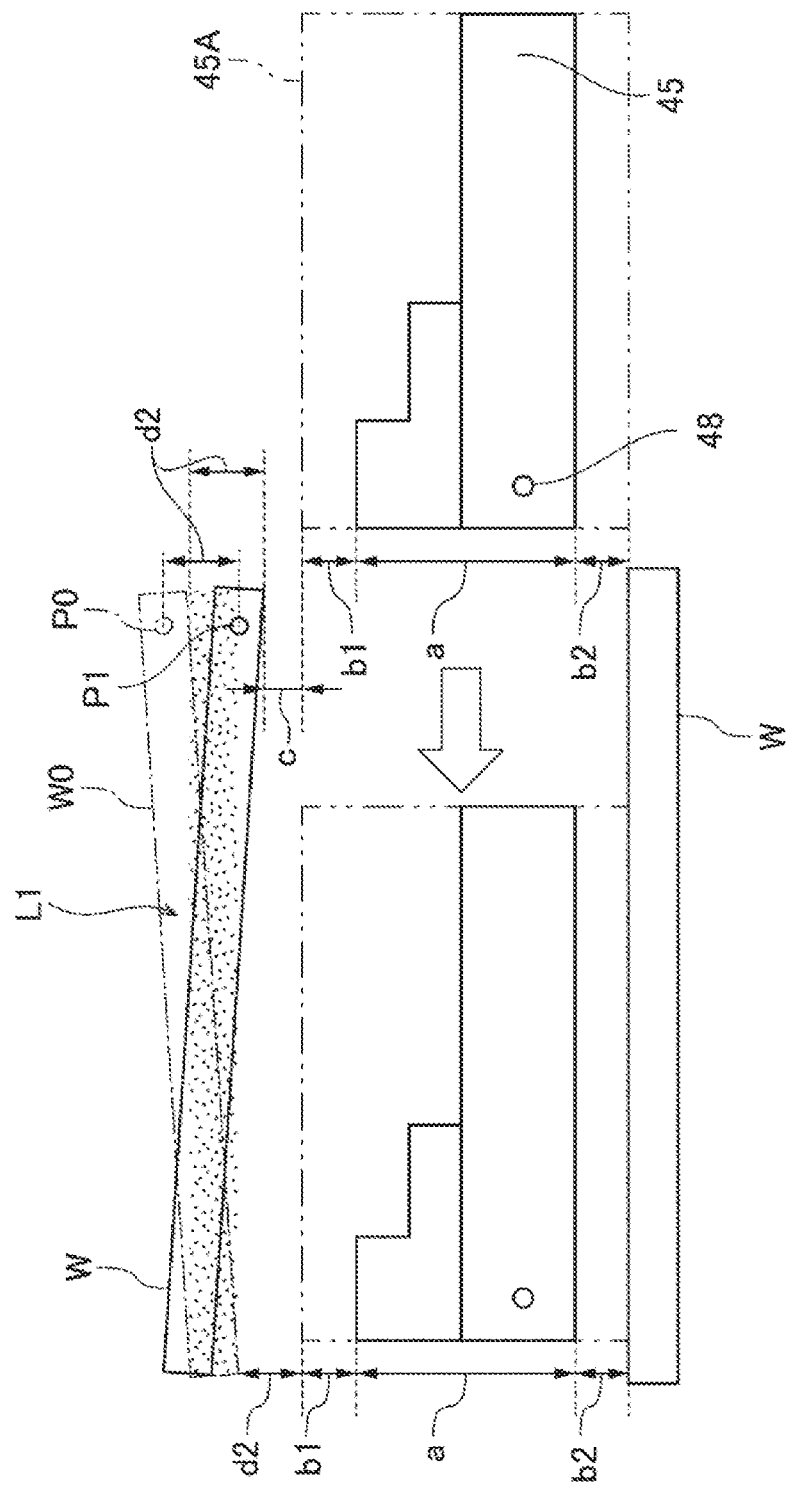
FIG. 6 is an explanatory view illustrating a method of determining an approach height of a substrate support part in a comparative example.

In the comparative example, the entry height of the substrate support part 45 is determined such that the height c of the clearance is secured between the lower surface of the front end of the wafer W and the virtual support part 45A, without considering the reference height P0 and the detection height P1 of the wafer W. Referring to FIGS. 5 and 6, which schematically show the substrate support part 45 enters the transfer container B after the entry height is determined, as in FIG. 4, a method of determining the entry height in the comparative example will be specifically described. In FIGS. 5 and 6 and the subsequent drawings, the wafer W stored in one slot in which the target wafer W is stored at the time of teaching is denoted as W0. The reference height P0 obtained from the wafer W0 indicates the center position of the vertical width of the wafer W as well as the detection height P1.

In the example shown in FIG. 5, it is assumed that the wafer W0 is in the worst case as described with reference to FIG. 4, and that the lower surface thereof is stored to be within the permissible area L1. Thus, the reference height P0 of the wafer W in the one slot is equal to the detection height P1 in FIG. 4, and thus the entry height of the substrate support part 45 set at the time of teaching in the example described with reference to FIG. 5, is equal to the entry height of the substrate support part 45 shown in FIG. 4. FIG. 5 shows an example in which the detection height P1 of the target wafer W to be received in one slot is detected at a position lower by d1 than the reference height P0. That is, the lower surface of the front end of the wafer W is also located at a position lower by d1 than the position described in FIG. 4. Since it is conceivable that the wafer W with the detection height P1 having the height described above is stored as the worst case, the entry height of the substrate support part 45 set at the time of teaching is corrected so that the lower surface of the wafer W is lowered by the height c of the clearance+the height b1 of the upper side of the substrate support part 45. More specifically, from the fact that the reference height P0 in FIG. 5 is equal to the detection height P1 in FIG. 4, the entry height of the substrate support part 45 of the example shown in FIG. 5 is shifted by d1 below the entry height of the substrate support part 45 shown in FIG. 4, and thus the upper end of the virtual support part 45A is separated by d1 from the lower surface of the permissible area L1. In addition, although the target wafer W to be received can be assumed to be stored as the worst case as described above, the inclination and the positional relationship of the wafer W with the permissible area L1 are actually unknown at the time of receiving the wafer W. FIG. 5 shows the case in which the actual storage state of the target wafer W to be received is horizontal, the lower surface of the permissible area L1 coincides with the lower surface of the wafer W to be received, and the clearance height c=height d1 is satisfied.

Further, FIG. 6 shows an example in which the detection height P1 of the wafer W in one slot is located at a position lower by a height d2 than the reference height P0. That is, the lower surface of the front end of the wafer W is also located at a position lower by a height d2 than the position described in FIG. 4. In the example of FIG. 6, it is assumed that the wafer W0 at the time of teaching is stored in the same state as that described with FIG. 5, and therefore, the reference height P0 in the example of FIG. 6 is equal to the detection height P1 in FIG. 4 as in the example of FIG. 5.

Even in the example shown in FIG. 6, it is assumed that the wafer W is stored in the worst case, as described with FIG. 5, and the entry height of the substrate support part 45 is determined such that a height b1+c is secured above the substrate support part 45. Thus, in the example of FIG. 6, the entry height of the substrate support part 45 is shifted downwards by a height d2 from the entry height set at the time of teaching, whereby the upper end of the virtual support part 45A is corrected to also be lowered by d2 from the lower surface of the permissible area L1. In order to avoid the redundancy shown in the drawings, in FIG. 6 and FIG. 8, described later, a frame indicating the permissible area L1 is not indicated, and only the dots are indicated, unlike what is shown in FIG. 4.

However, for example, when the wafer W is returned to the transfer container B in the previous process before the wafer W is transferred to the vacuum-processing apparatus 1, there may be a case where the wafer W is brought into contact with the rear inner wall of the container body B1 and the front side of the wafer W is positioned lower than the rear side, i.e., the wafer W is in a front-lower posture, so that the position of the lower surface is out of the permissible area L1 defined by the semi-standard. FIG. 6 shows an example in which the target wafer W to be received is in the front-lower posture as described above and thus is out of the permissible area L1. Accordingly, the height d2 is relatively large. In determining the entry height of the substrate support part 45 like the comparative example in a case where the degree of the front-lower posture is greater than that in the example of FIG. 6, since it is necessary to secure the height b2 in order to prevent contact between the substrate support part 45 and the surface of the wafer W in the lower side, the loading of the wafer W need to be stopped.

Figure 7:
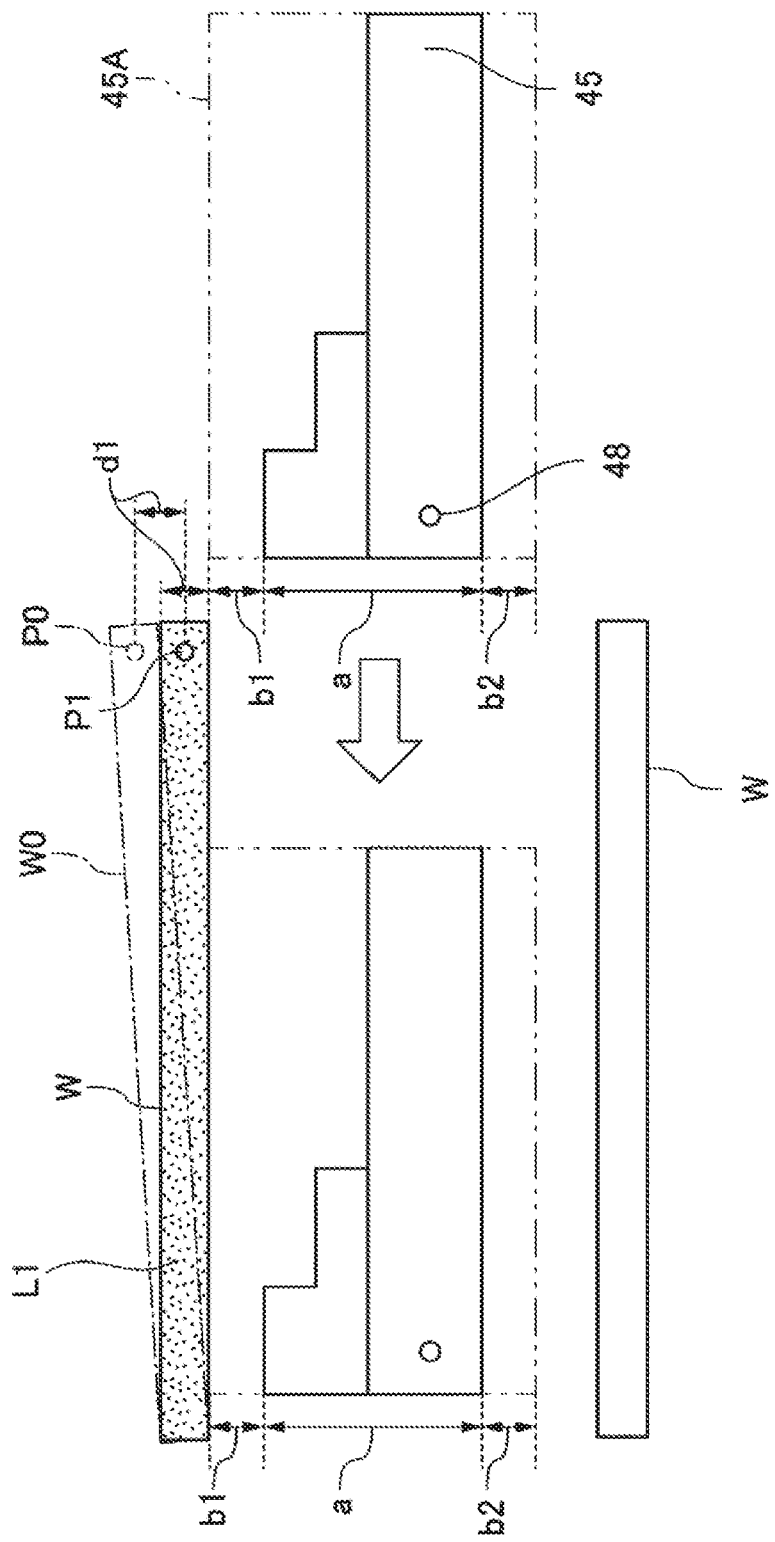
FIG. 7 is an explanatory view illustrating a method of determining an approach height of a substrate support part in an embodiment.

For example, when the vertical amplitude of the substrate support part 45 is large, it is necessary to set the heights b1 and b2 of the virtual support part 45A to be relatively large. On the other hand, even when the degree of the front-lower posture is large and exceeds the semi-standard, it is required to determine the entry height of the substrate support part 45 so as not to contact the wafer W. The method of determining the entry height of the substrate support part 45 of the embodiment can satisfy these requirements. The method of determining the height of the substrate support part 45 of this embodiment will be described with reference to FIGS. 7 and 8, focusing on differences from the method of determining the entry height in the comparative examples. FIGS. 7 and 8 show that the height and inclination of the target wafer W to be received are equal to the height and the inclination of the target wafer W to be received in FIGS. 5 and 6. In addition, the height and inclination of the wafer W0 at the time of teaching are also shown to be the same as the height and the inclination of the wafer W0 in FIGS. 5 and 6. Accordingly, the reference height P0 in FIGS. 7 and 8 is the same as the reference height P0 in FIGS. 5 and 6.

In the method of determining the entry height according to this embodiment, a difference value (referred to as a first difference value) between the reference height P0 and the detection height P1 is calculated. Further, it is assumed that the first difference value is +, when the detection height P1 is positioned lower than the reference height P0. Then, the first difference value is compared with the height c (>0) of the clearance. More specifically (a second difference value=the first difference value−the height c of the clearance) may be calculated and whether the relationship (second difference value>0) is satisfied is determined.

In FIG. 7, the height d1 is a first difference value. Since d1=c is satisfied in this case as described with reference to FIG. 5, a second difference value=(first difference value−height c of clearance)≤0 is satisfied in the example of FIG. 7. When the second difference value is equal to or less than 0, the entry height of the substrate support part 45 is not corrected, and as described with reference to FIG. 4, the substrate support part 45 is determined to advance at a height corresponding to the height set at the time of teaching, that is, the reference height P0. As described above, the wafer W0 is in the worst case and the lower surface of the wafer W0 is stored in the permissible area L in the example of FIG. 7. Accordingly, when the entry height of the substrate support part 45 is determined in this way, the lower surface of the permissible area L1 and the upper end of the virtual support part 45A are aligned In FIG. 8, the height d2 is a first difference value, and it is assumed that d2>c is satisfied in this case. Accordingly, a second difference value=(first difference value−height c of clearance)>0 is satisfied. In this case of the second difference value, the entry height of the substrate support part 45 is corrected. However, unlike the correction of the comparative example, only a portion in which the first difference value d2 exceeds the height c is corrected. That is, the entry height is corrected so as to be shifted downwards from the predetermined entry height by the second difference value=d2−c. As described above, the wafer W0 is in the worst case and the lower surface of the wafer W0 is stored in the permissible area L1 in the example of FIG. 8. Accordingly, when the entry height of the substrate support part 45 is determined in this way, the upper end of the virtual support part 45A is positioned so as to be lowered downwards from the lower surface of the permissible area L1 by d2−c.

That is, even in this embodiment, the height c of the clearance is set under the assumption that the target wafer W to be received is the worst case like the comparative example. Therefore, in even a case where the target wafer W to be received is inclined such that the front side of the wafer W is lowered compared to the wafer W at the time of the teaching so that the detection height p1 is positioned lower than the reference height P0, the virtual support part 45A and the wafer W are not in contact with each other as long as a difference value between the heights P1 and P0 does not exceed the height c. Thus, when the difference value does not exceed the height c as described above, the substrate support part 45 is advanced without correcting the entry height of the substrate support part 45 set at the time of the teaching, as in the example shown in FIG. 7. When the difference value between the heights P1 and P0 exceeds the height c, the amount of downward correction of the entry height is minimized by correcting the entry height by the excess amount as shown in the example of FIG. 8.

The method of determining the entry height according to the embodiment as described above, can suppress an increase in the amount of downward correction of the entry height of the substrate support part 45 when the detection height P1 is lowered with respect to the reference height P0, compared to the method of determining the entry height in the comparative example. As a result of correcting the entry height of the substrate support part 45, if the virtual substrate support part 45A is to be contacted with the wafer W in the lower side, the receiving operation should be stopped. However, since the amount of correction of the entry height can be suppressed as described above, the wafer W can be received even when the difference between the reference height P0 and the detection height P1 is larger. In other words, it is possible to receive even a wafer W in a more significant front-lower posture. Therefore, it is possible to suppress the stop of the reception of the wafer W due to a problem with the posture of the wafer W, so that the productivity of the vacuum-processing apparatus 1 can be increased. The fact that the wafer W can be received even when the difference between the reference height P0 and the detection height P1 is larger, as described above, means that, when adjusting the vertical amplitude or the horizontality of the substrate support part 45 in operation, it is possible to increase the allowable range of the amplitude and the horizontality. Therefore, it is possible to reduce the labor for adjusting the apparatus.

The control part 6 shown in FIG. 1 includes a program 61 having instructions (individual steps) to perform the transfer of the wafer W between the above-described respective modules, the processing of the wafer W in the film-forming module 2, and the method of determining the entry height in the embodiment. A control signal is output to each part of the vacuum-processing apparatus 1 by the program 61, and the operation of each part is controlled. The program 61 is installed by the control part 6 in the state in which the program 61 is stored in a storage medium such as a compact disk, a hard disk, a magneto-optical disk (MO), or a DVD. The control part 6 also includes a storage part 62. A variety of types of data are stored in the storage part 62 so that the method of determining the height of the substrate support part 45 according to the above-described embodiment can be performed. Specifically, the reference height P0 of the wafer W in each slot obtained by the teaching, the entry height of the substrate support part 45 corresponding to each reference height P0, and the height c of the clearance are stored. Further, when the detection height P1 of each wafer W is acquired at the time of operation of the apparatus (at the time of processing the product wafer W), the acquired detection height P1 is stored in the storage part 62.

Next, referring to FIG. 9, which is a flowchart obtained by summarizing the method of determining the entry height of the substrate support part 45 according to the embodiment, the method of determining the height will be described in sequence. First, in Step S1, the above-described teaching is performed to acquire the reference height P0 of the wafer W in each slot and the entry height of the substrate support part 45 corresponding to the reference height P0. Next, in Step S2, the operation of the vacuum-processing apparatus 1 is started, and the transfer container B in which the wafer W is stored is loaded on the loading port 5. In Step S3, the cover body B2 of the transfer container B is removed and mapping is performed to obtain the detection height P1 of the wafer W in each slot. In Step S4, a first difference value, which is a difference value between the reference height P0 and the detection height P1, is calculated with respect to the wafer W in one slot. Next, in Step S5, ((first difference value)−(height c of clearance)) is calculated as a second difference value. In Step S6, whether (second difference value>0) is satisfied is determined. Step S6 corresponds to a process of determining the entry height, which determines whether the substrate support part 45 enters at an entry height (first entry height) stored in the control part 6 or at an entry height (second entry height) corrected from the first entry height.

In Step S7, if the second difference value>0 is unsatisfactory, that is, if the second difference value≤0 is determined to be satisfied, the entry height of the substrate support part 45 is not corrected, and the substrate support part 45 advances at the entry height set in Step S1 and enters the transfer container B, so that the reception of the wafer W is performed. FIG. 7 illustrates the above operation of the substrate support part 45 in Step S7. In Step S8, when the second difference value>0 is determined to be satisfied, the entry height of the substrate support part 45 is corrected to be shifted downwards by an amount of the second difference value, and the substrate support part 45 is allowed to advance at the corrected height and enters the transfer container B, so that the reception of the wafer W is performed. FIG. 8 illustrates the above operation of the substrate support part 45 in Step S8. The wafers W received in Steps S7 and S8 are transferred into the housing 31 of the loader module 2 as described above, and are then transferred into the vacuum-processing apparatus 1 through the above-described path to then be returned to the transfer container B.

Although the case in which the wafer W in one slot of the transfer container B is taken out has been described, the first difference value and the second difference value are calculated with respect to the wafer W in each slot in the transfer container B, so that the entry height of the substrate support part 45 for taking out the wafer W is determined. That is, the above Steps S1 to S8 are performed with respect to each wafer W in the transfer container B. However, only one wafer W may be taken out according to the flow of Steps S1 to S8.

On the other hand, in the above example, the substrate support part 45 includes a pressing mechanism for the wafer W including the roller 49 and the driving mechanism 40. However, the substrate support part 45 does not need to have such a pressing mechanism. When such a pressing mechanism is provided, there is the concern that a relatively large amplitude will be generated in the substrate support part 45 due to the influence of the weight of the pressing mechanism. In this case, since the height b1 and the height b2 described in FIG. 4 become relatively large, the technique of the present disclosure is particularly effective. Further, the sensor part 47 performing the mapping may be provided to be raised and lowered in the vicinity of the transfer port 51 by a lifting mechanism, independently from the substrate support part 45. Although the vacuum-processing apparatus 1 includes the film-forming module 2, the vacuum-processing apparatus 1 may include a module for performing processes other than film forming, such as etching or annealing. The loader module 3 is not limited to being embedded in an apparatus for performing processes on a substrate in a vacuum atmosphere, or may be embedded in a substrate-processing apparatus that performs processes on a substrate in an atmospheric environment, such as applying a resist or supplying a developing solution.

Further, although the entry height of the substrate support part 45 based on the reference height P0 is previously stored in the control part 6, and the above entry height is corrected, only the reference height P0 may be stored in the control part 6. That is, when the detection height P1 is obtained and the second difference value calculated as described above is equal to or less than zero, a predetermined value A1 is subtracted from the reference height P0, so that the entry height of the substrate support part 45 is determined to be lowered by A1 from P0. When the second difference value is more than zero, the predetermined value A1 is subtracted from the reference height P0 and a second difference value A2 is subtracted therefrom, so that the entry height of the substrate support part 45 is determined to be lowered by A1+A2 from P0. That is, the present disclosure is not limited to correcting the entry height of the substrate support part 45 previously stored in the control part 6. In the above example, the height of the wafers W in the slots 2 to 24 is calculated using the height of each wafer W in the slots 1 and 25 at the time of mapping, but the heights of the wafers W in these slots 2 to 24 may be directly detected by raising and lowering the sensor part 47.

Although the first difference value is calculated as the difference value between the reference height P0 and the detection height P1, it is also possible to use a resultant value obtained by adding, for example, a predetermined correction value to the difference value between the height P0 and the height P1, as the first difference value. That is, the first difference value may be a value corresponding to the difference between the reference height P0 and the detection height P1. Similarly, the second difference value is calculated as the difference value between the first difference value and the height c of the clearance, but it is possible to use a value corrected by adding, for example, a predetermined correction value to the above difference value, as the second difference value. That is, the second difference value may be a value corresponding to the difference between the first difference value and the height c of the clearance. The value corresponding to the difference used herein includes the difference itself.

In addition, the height c of the clearance shown in FIG. 4 and the like may be set to 1 mm, in the above example, assuming that the wafer W is in the worst case. However, the height c of the clearance may be set smaller than 1 mm, assuming that the wafer W is not in the worst case, or may be set larger than 1 mm, assuming that the wafer W is inclined so that the rear end of the wafer W is lowered further compared to the worst case. The height c may be set to 0.5 mm to 1.5 mm in consideration of the fact that the substrate support part 45 is likely to be brought into contact with the lower wafer W, when the height c is excessively large. The height a of the substrate support part 45 shown in FIG. 4 and the like is 3 mm to 6 mm, the height b1 set on the upper side of the substrate support part 45 is 1 mm to 3 mm, and the height b2 set on the lower side of the substrate support part 45 is 1 mm to 3 mm.

According to the present disclosure, it is possible to minimize the occurrence of failure of taking out the substrate from the transfer container due to a posture defect of the substrate.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate transfer method comprising:
    loading a transfer container for vertically storing a plurality of substrates on a loading part provided on an outer side of a housing such that a substrate outlet formed in a lateral side of the transfer container overlaps a substrate transfer opening formed in a side wall of the housing;
    transferring the substrate between the transfer container loaded on the loading part and an inside of the housing by a transfer mechanism including a substrate support part supporting a lower surface of the substrate, the substrate support part moving in a vertical direction and a horizontal direction;
    acquiring a reference height of each substrate in the transfer container loaded on the loading part before performing the loading the transfer container and the transferring the substrate;
    detecting a height of each substrate in the transfer container loaded on the loading part by a sensor part after the acquiring the reference height and the loading the transfer container and before the transferring the substrate;
    obtaining a first difference value corresponding to a difference between the height of the substrate detected in the detecting the height and the reference height, with respect to one substrate in the transfer container;
    subsequently, determining an entry height of the substrate support part at which the substrate support part enters the transfer container by selecting one of a first entry height corresponding to the reference height of the one substrate and a second entry height corrected based on the first difference value, based on a predetermined height interval and the first difference value; and
    receiving the one substrate by allowing the substrate support part to enter the transfer container at the determined entry height.

2. The substrate transfer method of claim 1, wherein the determining the entry height further comprises:
    obtaining a second difference value corresponding to a difference between the predetermined height interval and the first difference value, and
    selecting one of the first entry height and the second entry height as the entry height based on the second difference value.

3. The substrate transfer method of claim 2, wherein
    the first difference value is a difference between the height of the substrate detected in the detecting the height and the reference height, and
    the determining the entry height includes determining the entry height of the substrate support part as the first entry height when (the first difference value−the predetermined height interval≤0) is satisfied, and determining the entry height of the substrate support part as the second entry height when (the first difference value−the predetermined height interval>0) is satisfied.

4. The substrate transfer method of any one of claim 1, wherein the obtaining the first difference value, the determining the entry height, and the receiving the one substrate are performed on each substrate in the transfer container.

5. A substrate transfer module comprising:

a housing including a substrate transfer opening formed in a side wall of the housing:
a loading part loading a transfer container for vertically storing a plurality of substrates on an outer side of the housing such that a substrate outlet formed in a lateral side of the transfer container overlaps the substrate transfer opening;
a transfer mechanism including a substrate support part supporting a lower surface of the substrate to transfer the substrate between the transfer container and an inside of the housing, the substrate support part moving in a vertical direction and a horizontal direction;
a sensor configured to detect a height of each substrate so that the substrate support part receives each substrate stored in the transfer container loaded on the loading part;
a storage configured to store a reference height of each substrate stored in the transfer container loaded on the loading part; and
a controller configured to output control signals to:
obtain a first difference value corresponding to a difference between the height of the substrate detected by a sensor part and the reference height with respect to one substrate in the transfer container loaded on the loading part,
determine an entry height at which the substrate support part enters the transfer container by selecting one of a first entry height corresponding to the reference height of the one substrate and a second entry height corrected based on the first difference value, based on a predetermined height interval and the first difference value, and
receive the one substrate by allowing the substrate support part to enter the transfer container at the determined entry height to transfer the received one substrate into the housing.

* * * * *